(12) United States Patent
Janfaoui et al.

(10) Patent No.: US 11,639,916 B2
(45) Date of Patent: May 2, 2023

(54) COMPOSITE PART WITH INTEGRAL ELECTRONIC INSTRUMENTATION CIRCUIT AND ITS MANUFACTURING METHOD

(71) Applicant: SAFRAN, Paris (FR)

(72) Inventors: Sabri Janfaoui, Moissy-cramayel (FR); Rafik Hadjria, Moissy-cramayel (FR)

(73) Assignee: SAFRAN, Paris (FR)

( * ) Notice: Subject to any disclaimer, the term of this patent is extended or adjusted under 35 U.S.C. 154(b) by 390 days.

(21) Appl. No.: 16/761,130

(22) PCT Filed: Nov. 5, 2018

(86) PCT No.: PCT/FR2018/052712
§ 371 (c)(1),
(2) Date: May 1, 2020

(87) PCT Pub. No.: WO2019/086815
PCT Pub. Date: May 9, 2019

(65) Prior Publication Data
US 2020/0271626 A1    Aug. 27, 2020

(30) Foreign Application Priority Data
Nov. 6, 2017    (FR) ...................... 17 60375

(51) Int. Cl.
*G01N 29/24*    (2006.01)
*H03H 3/02*    (2006.01)
(Continued)

(52) U.S. Cl.
CPC .......... *G01N 29/2437* (2013.01); *H03H 3/02* (2013.01); *H05K 1/0212* (2013.01); *H05K 1/141* (2013.01);
(Continued)

(58) Field of Classification Search
CPC . H05K 2201/10151; H05K 2201/0068; H05K 2201/09283; H05K 2201/049;
(Continued)

(56) References Cited

U.S. PATENT DOCUMENTS

2002/0167783 A1    11/2002    Waffenschmidt et al.
2004/0046483 A1    3/2004    Dupont et al.
(Continued)

FOREIGN PATENT DOCUMENTS

CN    1554208 A    12/2004
CN    101294844 A    10/2008
(Continued)

OTHER PUBLICATIONS

International Search Report dated Feb. 4, 2019 in PCT/FR2018/052712 filed Nov. 5, 2018, 2 pages.
(Continued)

*Primary Examiner* — Arnold M Kinkead
(74) *Attorney, Agent, or Firm* — Oblon, McClelland, Maier & Neustadt, L.L.P.

(57) ABSTRACT

A composite part (sandwich or monolithic), including a rigid outer surface, to which is integrated an electronic instrumentation circuit, the electronic instrumentation circuit including a piezoelectric transducer, connected to a coil, an electronic control circuit, connected to a coil positioned facing the coil. The coil is printed on an insulating layer, printed directly on the rigid outer surface, the coil is printed on an insulating layer, covering the coil and the transducer, conducting tracks are printed on an insulating layer printed on at least one portion of the coil to be connected to it, the electronic control circuit being attached to the rigid outer surface and being connected to the tracks.

16 Claims, 4 Drawing Sheets

(51) Int. Cl.
*H05K 1/02* (2006.01)
*H05K 3/00* (2006.01)
*H05K 1/18* (2006.01)
*H05K 1/14* (2006.01)
*H05K 3/46* (2006.01)
*H05K 1/16* (2006.01)

(52) U.S. Cl.
CPC ............ *H05K 1/165* (2013.01); *H05K 1/186* (2013.01); *H05K 3/007* (2013.01); *H05K 3/4644* (2013.01); *H05K 3/4667* (2013.01); *H05K 3/4688* (2013.01); *H05K 2201/049* (2013.01); *H05K 2201/09263* (2013.01); *H05K 2201/10068* (2013.01); *H05K 2201/10151* (2013.01)

(58) Field of Classification Search
CPC .. H05K 3/4688; H05K 3/4667; H05K 3/4644; H05K 1/165; H05K 1/141; H05K 1/186; H05K 1/0212; H05K 2201/10068; H05K 3/007; H05K 2201/09263; G01N 29/2437; G01N 2291/0231; G01N 2291/2694; H03H 3/02
USPC ......... 73/594, 632, 760, 763, 774, 778, 781, 73/783, 802; 331/167
See application file for complete search history.

(56) References Cited

U.S. PATENT DOCUMENTS

| | | | |
|---|---|---|---|
| 2007/0012111 A1* | 1/2007 | Kim | ............... G01H 9/004 73/632 |
| 2010/0096183 A1 | 4/2010 | Rice | |
| 2012/0280768 A1 | 11/2012 | Nakayama et al. | |
| 2013/0120415 A1 | 5/2013 | Zuo et al. | |
| 2016/0036416 A1 | 2/2016 | Nakayama et al. | |

FOREIGN PATENT DOCUMENTS

| | | | | |
|---|---|---|---|---|
| CN | 102565570 A | 7/2012 | | |
| CN | 103282784 A | 9/2013 | | |
| CN | 103776526 A | 5/2014 | | |
| CN | 104037493 A | 9/2014 | | |
| CN | 104767499 A | 7/2015 | | |
| CN | 105378500 A | 3/2016 | | |
| EP | 1 257 156 A2 | 11/2002 | | |
| EP | 1257156 A2 * | 11/2002 | ......... | H01F 27/2804 |
| WO | WO-2006041513 A1 * | 4/2006 | ............... | G01B 5/30 |
| WO | WO 2009/056472 A1 | 5/2009 | | |
| WO | WO 2013/074261 A1 | 5/2013 | | |

OTHER PUBLICATIONS

Paget, "Active Health Monitoring of Aerospace Composite Structures by Embedded Piezoceramic Transducers," Department of Aeronautics, Royal Institute of Technology, Nov. 2001,42 pages total.

Moulin et al., "Piezoelectric transducer embedded in a composite plate: Application to Lamb wave generation," Journal of Applied Physics, vol. 82, No. 5, Sep. 1, 1997, 8 pages total.

Murayama et al., "Noncontact Driving System Using Induction-Based Method and Integrated Piezoelectric Ultrasonic Transducers," Journal of Sensor Technology, vol. 2, Jun. 2012, 8 pages total.

* cited by examiner

COMPOSITE PART WITH INTEGRAL ELECTRONIC INSTRUMENTATION CIRCUIT AND ITS MANUFACTURING METHOD

BACKGROUND OF THE INVENTION

Field of the Invention

The invention relates to a composite part (monolithic or sandwich) comprising a rigid outer surface, with which is integrated an electronic instrumentation circuit, as well as a manufacturing method for the part.

One field of application of the invention relates to structures used in the field of aeronautics, for example portions of aircraft nacelles.

Description of the Related Art

In order to follow the evolution of the state of health of aeronautical structures, it is desired to use systems for diagnosing the condition of the structure, also called SHM (Structural Health Monitoring) systems, which allow following the state of health of a structure throughout its lifetime, this by detecting, localizing and characterizing the presence of a fault having occurred because of environmental operating stresses (temperature, mechanical stresses or others) or because of an impact resulting from a foreign body (debris, bird impact or others).

A diagnostic system comprises a set of transducers (temperature, force, deformation sensors, or others), control electronics, and a processing unit. The processing unit is associated with a human-machine interface allowing an operator to investigate the faults.

The diagnostic system may be totally or partially on board the structure, and this depends on several factors (temperature, weight, autonomy . . . ) but as a minimum the sensors are on board the structure to be instrumented.

Among the sensor/transducer technologies most used for the detection of faults in metal structures and structures of composite materials is the use of piezoelectric transducers, for example of the PZT (lead zirconate titanate) type. The latter can be used in the emission mode (generation of a guided wave which propagates in the structure), or in reception mode (listening to the propagated wave). By exciting the transducer with a predefined electrical signal, the transducer transforms this electric signal into a guided mechanical wave. This wave propagates in the structure. Upon arriving at a fault, this wave is reflected and is detected by one or more other transducers placed on or in the structure. Upon receiving the reflected wave, the transducer transforms the wave into an electrical signal. The electrical signals recovered by the different transducers are then sent to the processing unit in order to detect the presence of a fault, to localize it and to characterize it.

A diagnostic system is beneficial for the optimization of the maintenance of the equipment. Nevertheless, it engenders the addition of a non-negligible mass to the weight of the structure to be instrumented (weight of the electrical cables, of cable attachments, of connection hardware). Another difficulty consists of integrating the transducers in the composite structure. Several problems are identified such as the passage of electrical cables through carbon plies (creation of failure sources), the dimension of the cables and of conduits (creation of excess thickness in the material).

One difficulty identified during a maintenance intervention consists of de-cabling the diagnostic system to repair the fault and then re-cabling the diagnostic system after the repair of the latter, in order to continue to follow the state of health of the equipment. This constraint results in an increase of the time and of the cost of maintenance.

BRIEF SUMMARY OF THE INVENTION

The invention aims to obtain a solution for integration of elements in the composite part, allowing lightening the weight of the cabling of the diagnostic system and integrating the transducers in the part, while dispensing with problems linked to the cabling of transducers through the structure.

To this end, a first subject matter of the invention is a composite part, comprising a rigid outer surface, to which is integrated an electronic instrumentation circuit, the electronic instrumentation circuit comprising:
at least one piezoelectric transducer, connected to a first coil,
an electronic control circuit, connected to a second coil positioned facing the first coil,
characterized in that
the first coil is printed on at least one first electrically insulating layer printed directly on the rigid outer surface,
the second coil is printed on at least one third electrically insulating layer covering the first coil and the piezoelectric transducer,
first and second electrically conducting tracks are printed on a fifth electrically insulating layer printed on at least one portion of the second coil to be connected to the second coil,
the electronic control circuit being attached to the rigid outer surface and being connected by a first electrical connection means to the first and second electrically conducting tracks.

Thanks to the invention, both the first coil connected to the piezoelectric transducer and the second coil connected to the electronic control circuit are integrated by the same printing technique to the composite part, thus allowing gains in compactness, in miniaturization, in lightness and in manufacturing cost. In fact, particularly in the field of aeronautics, it is necessary that the instrumentation circuit perturb as little as possible the flow of fluid surrounding the composite part.

According to one embodiment of the invention, at least one strain gauge, terminated by a third end contact and by a fourth end contact, and third and fourth electrically conducting tracks, connected respectively to the third end contact and to the fourth end contact, are printed on the third electrically insulating layer, the strain gauge and the third and fourth electrically conducting tracks being at a distance from the first and second tracks, the electronic control circuit being connected by a second electrical connection means to the third and fourth electrically conducting tracks.

According to one embodiment of the invention, at least one temperature sensor, terminated by a fifth end contact and by a sixth end contact, and fifth and sixth electrically conducting tracks, connected respectively to the fifth end contact and to the sixth end contact, are printed on the third electrically insulating layer, the temperature sensor and the fifth and sixth electrically conducting tracks being at a distance from the first and second tracks, the electronic control circuit being connected by a third electrical connection means to the fifth and sixth electrically conducting tracks.

According to one embodiment of the invention, the first coil comprises a first electrical conductor having at least one first turn terminated by a first end stud and by a second end stud, the first turn and the first and second end studs being printed in a second electrically conducting layer on the first electrically insulating layer, itself located on the rigid outer surface, the piezoelectric transducer having at least one first electrical terminal and one second electrical terminal, which are positioned in a plane positioned on the second layer, which are positioned respectively on the first and second studs and which are attached in an electrically conducting manner to the first and second studs, the second coil comprising a second electrical conductor having at least a second turn terminated by a first end contact and by a second end contact, the second turn and the first and second end contacts being printed in a fourth electrically conducting layer on the third layer, the first and second end contacts being connected respectively to the first and second electrically conducting tracks printed in a sixth electrically conducting layer positioned on the fifth electrically insulating layer printed on a portion of the fourth layer.

According to one embodiment of the invention, the strain gauge and the third and fourth electrically conducting tracks are printed in the fourth layer on the third layer.

According to one embodiment of the invention, the temperature sensor and the fifth and sixth electrically conducting tracks are printed in the fourth layer on the third layer.

According to one embodiment of the invention, the at least one first turn extends between an inner end and an outer end, the first stud is connected to the inner end of the at least one first turn, the second stud is connected to the outer end of the at least one first turn by a seventh electrically conducting track printed in a seventh electrically conducting layer positioned on an eighth electrically insulating layer printed on the second layer, the first and second studs are surrounded by the at least one first turn.

According to one embodiment of the invention, the first stud occupies a major portion of the space surrounded by the at least one first turn.

According to one embodiment of the invention, the third layer comprises a ninth electrically insulating passivation layer, covering the first coil and the piezoelectric transducer, and a tenth electrically insulating layer, printed between the ninth layer and the and the fourth layer.

According to one embodiment of the invention, the tracks and the fourth layer are covered with an eleventh electrically insulating passivation layer.

According to one embodiment of the invention, the rigid outer surface is of a monolithic composite material.

According to one embodiment of the invention, the rigid outer surface is of a composite material having a sandwich type structure.

According to one embodiment of the invention, the electrical connection means is flexible.

According to one embodiment of the invention, the composite part constitutes a portion of an aircraft turbomachine nacelle or an aircraft turbomachine blade.

According to one embodiment of the invention, the composite part comprises, as a rigid outer surface, a first rigid outer surface and a second rigid outer surface, which is remote from the first rigid outer surface, an electronic instrumentation circuit being integrated with each of the first and second rigid outer surfaces.

A second subject matter of the invention is a manufacturing method for manufacturing a composite part as described above, characterized in that during a first step, the first electrically insulating layer is printed on the rigid outer surface, during a second step subsequent to the first step, a second electrically conducting layer is printed on the first layer, to form the first coil comprising a first electrical conductor having at least one first turn terminated by a first end stud and by a second end stud, during a third step subsequent to the second step, the piezoelectric transducer having first and second electrical terminals positioned in a plane is positioned respectively on the first and second studs, and the first and second electrical terminals are attached in an electrically conducting manner respectively to the first and second studs, during a fourth step subsequent to the third step, the first coil and the piezoelectric transducer are covered with the at least one third electrically insulating layer, during a fifth step subsequent to the fourth step, a fourth electrically conducting layer is printed on the third layer, to form the second coil comprising a second electrical conductor having at least one second turn terminated by a first end contact and by a second end contact, the second coil being positioned facing the first coil, during a sixth step subsequent to the fifth step, the fifth electrically insulating layer is printed on a portion of the fourth layer and a sixth electrically conducting layer is printed on the fifth layer, to form the first and second electrically conducting tracks and to connect the first and second end contacts respectively to the first and second tracks, during a seventh step subsequent to the sixth step, the electronic control circuit is attached to the rigid outer surface and the electronic control circuit is connected by the first electrical connection means to the first and second electrically conducting tracks.

BRIEF DESCRIPTION OF THE SEVERAL VIEWS OF THE DRAWINGS

The invention will be better understood upon reading the description that follows, given solely by way of a non-limiting example with reference to the appended drawings, in which.

DETAILED DESCRIPTION OF THE INVENTION

Figure 1:
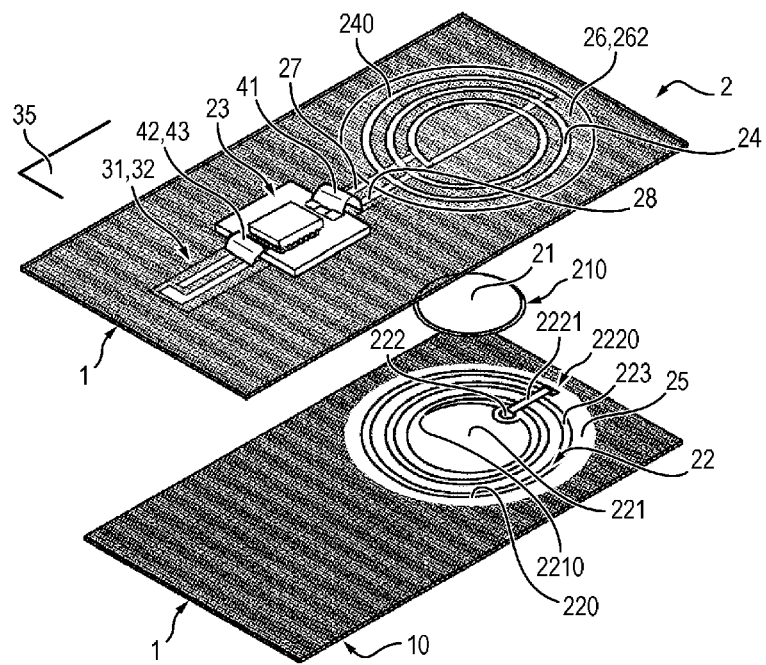
FIG. 1 shows schematically an exploded view of a composite part according to one embodiment of the invention.

In FIGS. 1 to 6, the composite part 1 comprises a rigid outer surface 10, with which is integrated an electronic instrumentation circuit 2. The composite part 1 is a rigid part. The composite part 1 may be of a monolithic composite material (as shown by the composite part 1a of FIG. 6) or of a composite material having a structure of the sandwich type (as shown by the composite part 1b of FIG. 6). The composite part 1 may for example be a carbon part, made for example of one or more superimposed carbon plies.

According to one embodiment, the composite part 1 has as a rigid outer surface 10 a first rigid outer surface with which is integrated the electronic instrumentation circuit 2 and a second rigid outer surface, which is remote from the first rigid outer surface and with which is integrated another electronic instrumentation circuit 2 similar to the circuit 2. The composite part 1 may thus be a part with a flat shape of which each of the two sides opposite one another (the first rigid outer surface and the second rigid outer surface) is equipped with an electronic instrumentation circuit 2. For example, the composite part 1 may in particular be an aeronautical part. In particular, the composite part is a part on board the aircraft. The composite part 1 may in particular be a portion of an aircraft turbomachine or a portion of an aircraft turbomachine nacelle or a structure of the IFS (internal fixed structure) type of a thrust reverser (nacelle), which may be equipped on each of its two opposite sides with an electronic instrumentation circuit 2. The composite part 1 may also be a rotating part or a portion of a rotating part, as for example an aircraft turbomachine blade.

The invention provides for integrating by printing the electronic instrumentation circuit 2 directly with the rigid outer surface 10 of the part 1 to be instrumented. Thus, the electronic instrumentation circuit 2 is on board the composite part 1.

The electronic instrumentation circuit 2 comprises one or more piezoelectric transducer(s) 21, for example of lead zirconate titanate (called PZT), which is (are) integrated into the rigid outer surface 10 of the part 1 to be instrumented. In the case of several piezoelectric transducers 21, these are spaced from one another on the rigid outer surface 10. What is described below for one piezoelectric transducer 21 applies to each piezoelectric transducer 21.

The piezoelectric transducer 21 is connected to a first coil 22 (also called a secondary coil 22), produced by printing on a first electrically insulating layer 25, printed directly on the rigid outer surface (10).

The electronic instrumentation circuit 2 also comprises an electronic control circuit 23 connected to a second coil 24 (also called a primary coil 24), which is positioned at a distance and facing the first coil 22 and which is produced by printing on another electrically insulating layer 26, covering the first coil 22 and the piezoelectric transducer 21 and printed on them.

First and second electrically conducting tracks 27, 28 are printed on a fifth electrically insulating layer 29 on at least a portion of the second coil 24, to be connected by printing to the second coil 24. The electronic control circuit 23 is attached to the rigid outer surface 10 and is connected by a first electrical connection means 41 to the first and second electrically conducting tracks 27, 28. The track 27 and/or 28 thus comprises a portion extending over the second coil 24 and another portion extending outside the second coil 24 until the first electrical connection means 41. The first electrical connection means 41 may be flexible.

The coils 24 and 22 are arranged to have mutual electromagnetic coupling, allowing them to transmit signals to one another without contact. The piezoelectric transducer 21 can thus be controlled without contact by the electronic control circuit 23, via the coil 24 and the coil 22. The coils 22 and 24 are produced by printing.

The operation of the circuit 2 is the following.

In a first, emission mode of the circuit 2, the electronic control circuit 23 sends the first electric control signal to the primary coil 24. The coil 24 transforms this first electrical signal into an electromagnetic field. The secondary coil 22, placed in this field, transforms this electromagnetic field into a second, excitation electrical signal. This second electrical excitation signal excites the transducer 21 and allows sending a guided mechanical wave into the material of the rigid outer surface 10.

In a second, reception mode of the circuit 2, the transducer 21 receives a wave emitted by another distant transducer 21 through the material of the rigid outer surface 10. This wave is transformed by the transducer 21 into a third electrical signal. The third electrical signal is transformed by the secondary coil into an electromagnetic field. This field is in turn transformed by the primary coil 24 into a fourth electrical signal. This fourth electrical signal is then recovered and processed by the electronic control circuit 23.

The analysis of the fourth electrical signal based on the first electrical control signal allows detecting a fault in the rigid outer surface 10 of the composite part 1. In one embodiment, the electronic control circuit 23 comprises means of processing the fourth electrical signal to detect and/or localize and/or identify a fault. In another embodiment, the electronic control circuit 23 is connected to another circuit for processing of the fourth electrical signal for detecting and/or localizing and/or identifying a fault.

In one embodiment, the electronic control circuit 23 comprises a means for accomplishing an auto-diagnostic of the transducer 21, this without contact, in order for example to detect a failure of the transducer 21 by measuring for example its characteristic electromagnetic impedance. This allows validating the operability or inoperability of the transducer 21 prior to its use for detecting faults.

Figure 4:
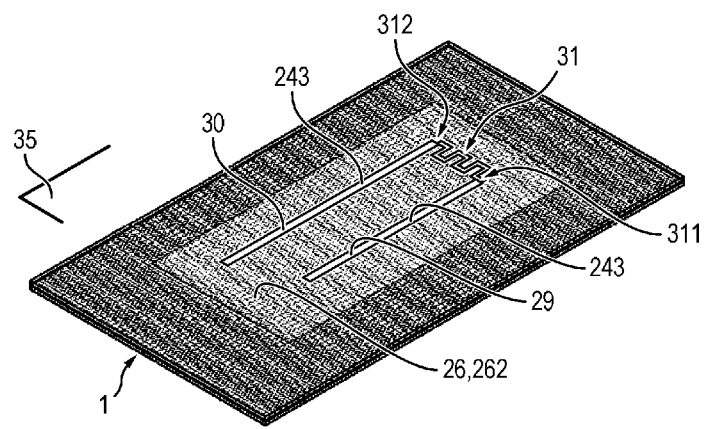

According to one embodiment, as shown in FIGS. 1 and 4, the composite part 1 may comprise one or more strain gauges 31, allowing measuring a deformation of the rigid outer surface 10. The at least one strain gauge 31 may also be printed on the fifth insulating layer 29. According to one embodiment, the at least one strain gauge 31 is terminated by the third end contact 311 and by a fourth end contact 312. Third and fourth electrically conducting tracks are printed on the third insulation layer 26 to be connected by printing respectively to the third end contact 311 and to the fourth end contact 312. The strain gauge 31 and the third and fourth tracks 29, 30 are at a distance from the first and second tracks 27, 28. The electronic control circuit 23 is connected by a second electrical connection means 42 to the third and fourth electrically conducting tracks 29, 30. The second electrical connection means 42 may be flexible.

Figure 5:
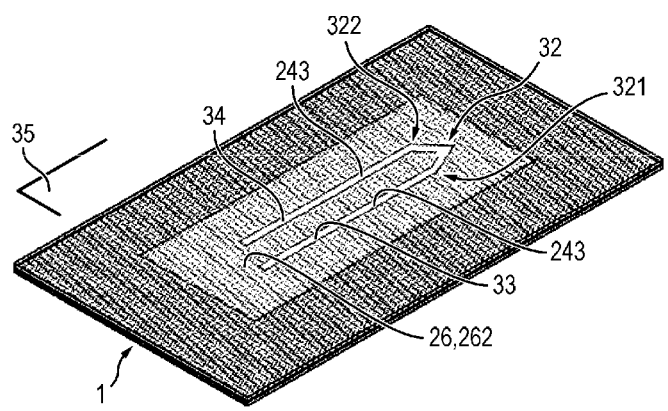
Figure 6:
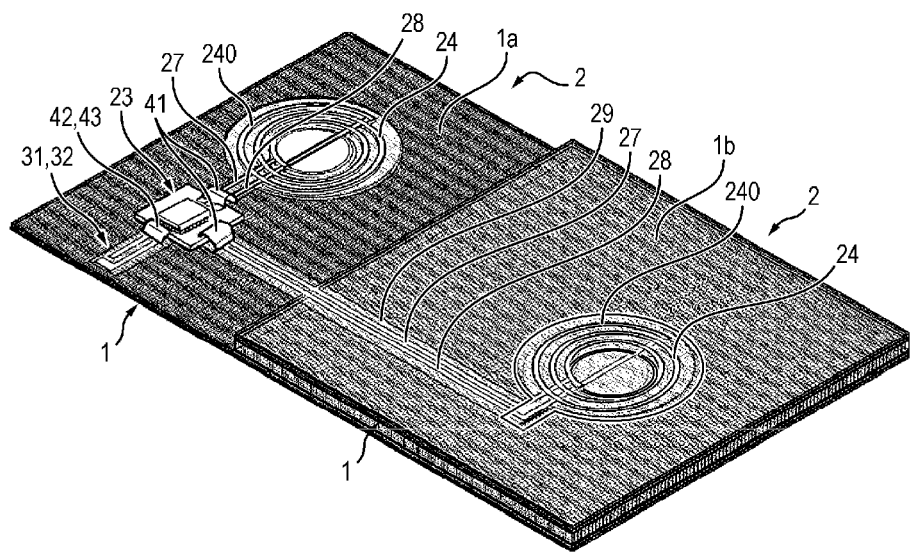
FIG. 6 shows schematically in an exploded view a composite part according to two embodiments of the invention.

According to one embodiment, as shown in FIGS. 1 and 5, the composite part 1 may comprise one or more temperature sensor(s) 32, allowing measuring a temperature of the rigid outer surface 10. The temperature sensor 32 may comprise a thermocouple, for example. The at least one temperature sensor 32 may also be printed on the fifth insulating layer 29. According to one embodiment, the at least one temperature sensor 32 is terminated by a fifth end contact 321 and by a sixth end contact 322. Fifth and sixth electrically conducting tracks 33, 34 are printed on the third electrically insulating layer 26, to be connected by printing respectively to the fifth end contact 321 and to the sixth end contact 322. The temperature sensor 32 and the fifth and sixth electrically conducting tracks 33, 34 are at a distance from the first and second tracks 27, 28 and from the third and fourth tracks 29, 30. The electronic control circuit 23 is connected by a third electrical connection means 43 to the fifth and sixth electrically conducting tracks 33, 34. The third electrically connection means 43 may be flexible.

Described below is an embodiment of the circuit 2 by printing, as shown in FIGS. 1 to 5. The circuit 2 comprises on the rigid outer surface 10, successively:
- the first electrically insulating layer 25,
- the second electrically conducting layer 223, to form the coil 22,
- the third electrically insulating layer 26,
- the fourth electrically conducting layer 243, to form the coil 24, and the tracks 29, 30 and/or 33, 34 when they are present,
- the fifth electrically insulating layer 29,
- the sixth electrically conducting layer 280, to form the tracks 27, 28.

These printed layers have the following localizations for integrating the transducer 21, the coils 22 and 24, and the tracks 27 and 28 serving for access to the electronic control circuit 23 by the coil 24.

Figure 2:
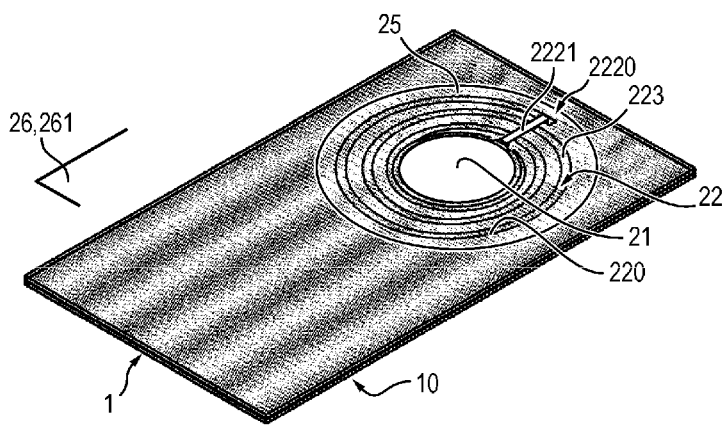
FIGS. 2, 3, 4 and 5 show schematically portions of the composite part according to FIG. 1.

According to one embodiment, as shown in FIGS. 1 and 2, the first coil 22 comprises a first electrical conductor having at least one first turn 220 terminated by a first end stud 221 and by a second end stud 222.

According to one embodiment, as shown in FIGS. 1 and 2, the first turn 220 and the first and second end studs 221, 222 are printed in the second electrically conducting layer 223 on the first electrically insulating layer 25, itself located on the rigid outer surface 10.

According to one embodiment, as shown in FIGS. 1 and 2, the piezoelectric transducer 21 has at least one first electrical terminal, and one second electrical terminal, which are positioned in a plane 210 positioned on the second layer 223. The first electrical terminals and the second electrical terminal are positioned respectively on the first stud 221 and on the second stud 222 and are attached in an electrically conducting manner respectively to the first stud 221 and to the second stud 222.

Figure 3:
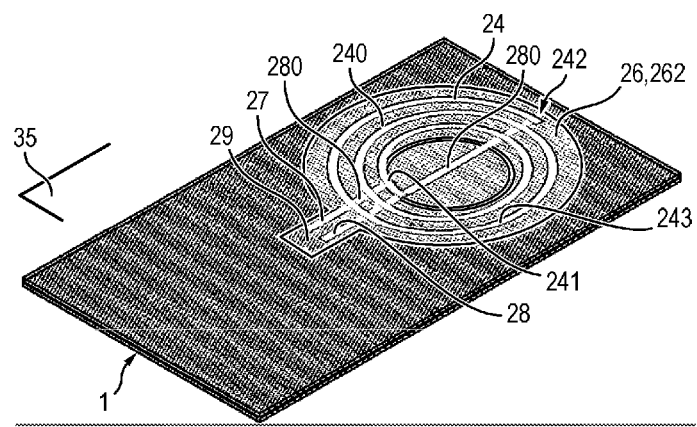

According to one embodiment, as shown in FIGS. 1 and 3, the second coil 24 comprises a second electrical conductor having at least one second turn 240 terminated by a first end contact 241 and by a second end contact 242. The second turn 240 and the first and second end contacts 241, 242 are printed in the fourth electrically conducing layer 243 on the third layer 26. The first and second end contacts 241, 242 are connected, respectively, to the first and second electrically conducting tracks 27, 28. The first and second electrically conducting tracks 27, 28 are printed in a sixth electrically conducting layer 280, positioned on the fifth electrically insulating layer 29, which is printed on a portion of the fourth layer 243.

According to one embodiment as shown in FIGS. 3 and 4, the strain gauge 31 and the third and fourth electrically conducting tracks 29, 30 are printed in the fourth layer 243 on the third layer 26.

According to one embodiment, as shown in FIGS. 3 and 5, the temperature sensor 32 and the fifth and sixth electrically conducting tracks 33, 34 are printed in the fourth layer 243 on the third layer 26.

Described below is an embodiment of the coil 22, as shown in FIGS. 1 and 2.

According to one embodiment, the at least one first turn extends between in inner end 2210 and an outer end 2220. The first stud 221 is connected to the inner end 2210, the second stud 222 is connected to the outer end 2220 by a seventh electrically conducting track 2221. The seventh electrically conducting track 2221 is printed in a seventh electrically conducting layer, positioned on an eighth electrically insulating layer, which is printed on the second layer 223. The first and second studs 221, 222 are surrounded by the at least one first turn.

According to one embodiment, the first stud 221 occupies a major portion of the space surrounded by the at least one first turn.

According to one embodiment, as shown in FIGS. 2 to 5, the third layer 26 comprises a ninth electrically insulating passivation layer 261, covering the first coil 22 and the piezoelectric transducer 21, and a tenth electrically insulating layer 262, printed between the ninth layer 261 and the fourth layer 243.

According to one embodiment, as shown in FIGS. 1, 3, 4 and 5, the tracks 27, 28, the fourth layer 243 and the tracks 29, 30 and/or 33, 34 when they are present, are covered with an eleventh electrically insulating passivation layer 35.

Figure 7:
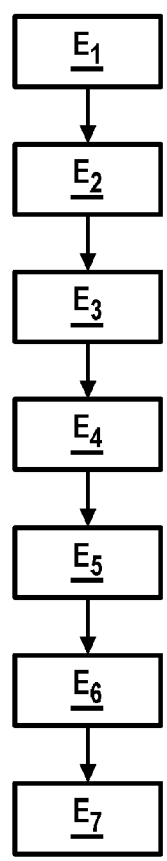
FIG. 7 shows a flowchart of the manufacturing method of the composite part according to one embodiment of the invention.

Described below, with reference to FIG. 7, is a manufacturing method of the composite part 1 described above. The printing steps may be carried out by a printing technique of the aerosol or inkjet type, for example.

During a first step $E_1$, the first electrically insulating layer 25 is printed on the rigid outer surface 10. The first insulating layer 25 is printed at the location defined to accommodate the coil 22 and the piezoelectric transducer 21 on the rigid outer surface 10.

During a second step $E_2$ subsequent to the first step $E_1$, the second electrically conducting layer 223 is printed on the first layer 25, to form the first coil 22 comprising a first electrical conductor having the at least one first turn 220 terminated by a first end stud 221 and by a second end stud 222. The imprint of the piezoelectric transducer 21 is also printed, leaving space for inserting it into said imprint.

During a third step $E_3$ subsequent to the second step $E_2$, the piezoelectric transducer 21 is positioned, by positioning the first and second electrical terminals positioned in the plane 210, respectively on the first and second studs 221, 222. The piezoelectric transducer 21 is thus positioned in its imprint, the piezoelectric transducer 21 being a prefabricated component. The first and second electrical terminals are attached in an electrically conducting manner respectively to the first and second studs 221, 222, for example using an electrically conducting adhesive deposited between, on the one hand, the first and second electrical terminals and, on the other hand, the first and second studs 221, 222.

During a fourth step $E_4$ subsequent to the third step $E_3$, the first coil 22 and the piezoelectric transducer 21 are covered with the at least one third electrically insulation layer 26. The third insulating layer 26 is printed at the location defined for accommodating the coil 24, the tracks 27 and 28, as well as the tracks 29, 30 and the at least one strain gauge 31 and/or the tracks 33, 34 and the at least one temperature sensor 32, when they are present.

During a fifth step $E_5$ subsequent to the fourth step $E_4$, a fourth electrically conducting layer 243 is printed on the third layer 26, to form, above the first coil 22, the second coil 24 comprising the second electrical conductor having at least one second turn 240 terminated by the first end contact 241 and by the second end contact 242, the tracks 27 and 28, as well as the tracks 29, 30 and the at least one strain gauge 31 and/or the tracks 33, 34 and the at least one temperature sensor 32, when they are present.

During a sixth step $E_6$ subsequent to the fifth step $E_5$, the fifth electrically insulating layer 29 is printed on a portion of the fourth layer 243. A sixth electrically conducting layer 280 is printed on the fifth layer 29, to form the first and second electrically conducting tracks 27, 28 and to connect the first and second end contacts 241, 242 respectively to the first and second tracks 27, 28.

During a seventh step $E_7$ subsequent to the sixth step $E_6$, the electronic control circuit 23 is attached to the rigid outer surface 10. The electronic control circuit 23 is connected by the first electrical connection means 41 to the first and second electrically conducting tracks 27, 28 and to the tracks 29, 30 by the means 42 and/or to the tracks 33, 34 by the means 43, when they are present.

Of course, the embodiments, features and examples above may be combined together or be selected independently of one another.

The invention claimed is:

1. A composite part, comprising:
   a rigid outer surface, to which is integrated an electronic instrumentation circuit,
   the electronic instrumentation circuit comprising:
      at least one piezoelectric transducer, connected to a first coil, and
      an electronic control circuit, connected to a second coil positioned facing the first coil,
   wherein
   the first coil is printed on at least one first electrically insulating layer printed directly on the rigid outer surface,
   the second coil is printed on at least one second electrically insulating layer covering the first coil and the piezoelectric transducer,
   the first coil and the second coil are arranged to have mutually electromagnetic coupling without coupling,
   a first electrically conducting track and a second electrically conducting track are printed on a third electrically insulating layer printed on at least one portion of the second coil to be connected to the second coil, the electronic control circuit being attached to the rigid outer surface and being connected by a first electrical connector to the first electrically conducting track and to the second electrically conducting track.

2. The composite part according to claim 1, wherein at least one strain gauge, which is terminated by a third end contact and by a fourth end contact, and a third electrically conducting track and a fourth electrically conducting track, which are connected respectively to the third end contact and to the fourth end contact, are printed on the at least one second electrically insulating layer,
   wherein the at least one strain gauge, the third electrically conducting track and the fourth electrically conducting track are at a distance from the first electrically conducting track and from the second electrically conducting track, and
   wherein the electronic control circuit is connected by a second electrical connector to the third electrically conducting track and to the fourth electrically conducting track.

3. The composite part according to claim 1, wherein at least one temperature sensor, which is terminated by a fifth end contact and by a sixth end contact, a fifth electrically conducting track and a sixth electrically conducting track, which are connected respectively to the fifth end contact and to the sixth end contact, are printed on the at least one second electrically insulating layer,
   wherein the at least one temperature sensor, the fifth electrically conducting track and the sixth electrically conducting track are at a distance from the first electrically conducting track and from the second electrically conducting track, and
   wherein the electronic control circuit is connected by a third electrical connector to the fifth electrically conducting track and to the sixth electrically conducting track.

4. The composite part according to claim 1, wherein the first coil comprises a first electrical conductor having art least one first turn terminated by a first end stud and by a second end stud,
   wherein the at least one first turn, the first end stud and the second end stud are printed in a first electrically conducting layer on the at least one first electrically insulating layer itself located on the rigid outer surface,
   wherein the at least one piezoelectric transducer has at least one first electrical terminal and one second electrical terminal, which are positioned in a plane positioned on the first electrically conducting layer, which are positioned respectively on the first end stud and on the second end stud and which are attached in an electrically conducting manner respectively to the first end stud and to the second end stud,
   wherein the second coil comprises a second electrical conductor having at least one second turn terminated by a first end contact and by a second end contact,
   wherein the at least one second turn, the first end contact and the second end contact are printed in a second electrically conducting layer on the at least one second electrically insulating layer, and
   wherein the first end contact and the second end contact are connected respectively to the first electrically conducting track and to the second electrically conducting track, which are printed in a third electrically conducting layer, positioned on the third electrically insulating layer, printed on a portion of the second electrically conducting layer.

5. The composite part according to claim 2, wherein at least one strain gauge, which is terminated by a third end contact and by a fourth end contact, and a third electrically conducting track and a fourth electrically conducting track, which are connected respectively to the third end contact and to the fourth end contact, are printed on the at least one second electrically insulating layer,
   wherein the at least one strain gauge, the third electrically conducting track and the fourth electrically conducting track are at a distance from the first electrically conducting track and from the second electrically conducting track,
   wherein the electronic control circuit is connected by a second electrical connector to the third electrically conducting track and to the fourth electrically conducting track, and
   wherein the at least one strain gauge, the third electrically conducting track and the fourth electrically conducting track are printed in the second electrically conducting layer on at least one second electrically insulating layer.

6. The composite part according to claim 4, wherein at least one temperature sensor, which is terminated by a fifth end contact and by a sixth end contact, a fifth electrically conducting track and a sixth electrically conducting track, which are connected respectively to the fifth end contact and to the sixth end contact, are printed on the at least one second electrically insulating layer,
   wherein the at least one temperature sensor, the fifth electrically conducting track and the sixth electrically conducting track are at a distance from the first electrically conducting track and from the second electrically conducting track, wherein the electronic control circuit is connected by a third electrical connector to the fifth electrically conducting track and to the sixth electrically conducting track, and wherein the at least one temperature sensor, the fifth electrically conducting track and the sixth electrically conducting track are printed in the second electrically conducting layer on at least one second electrically insulating layer.

7. The composite part according to claim 4, wherein at least one first turn extends between an inner end and an outer end, wherein the first end stud is connected to the inner end of the at least one first turn, wherein the second end stud is connected to the outer end of the at least one first turn by a seventh electrically conducting track printed in a fourth electrically conducting layer positioned on fourth electrically insulating layer printed on the first electrically conducting layer, and wherein the first end stud and the second end stud are surrounded by at least one first turn.

8. The composite part according to claim 7, wherein the first end stud occupies a major portion of a space surrounded by the at least one first turn.

9. The composite part according to claim 4, wherein the at least one second electrically insulating layer comprises a ninth electrically insulating passivation layer, covering the first coil and the at least one piezoelectric transducer, and a fifth electrically insulating layer, printed between the ninth layer and the fourth layer.

10. The composite part according to claim 4, wherein the first electrically conducting track and the second electrically conducting track and the second electrically conducting layer are covered with an eleventh electrically insulating passivation layer.

11. The composite part according to claim 1, wherein the rigid outer surface is of a monolithic composite material.

12. The composite part according to claim 1, wherein the rigid outer surface is of a composite material having a sandwich type structure.

13. The composite part according to claim 1, wherein the electrical connector is flexible.

14. The composite part according to claim 1, constituting a portion of an aircraft turbomachine nacelle or an aircraft turbomachine blade.

15. The composite part according to claim 1, wherein the composite part comprises, as a rigid outer surface, a first rigid outer surface and a second rigid outer surface, which is remote from the first rigid outer surface, an electronic instrumentation circuit being integrated with each of the first rigid outer surface and of the second rigid outer surface.

16. A manufacturing method for manufacturing a composite part according to claim 1, comprising:

printing during a first step the at least one first electrically insulating layer on the rigid outer surface, printing during a second step subsequent to the first step a first electrically conducting layer on the at least one first electrically insulating layer, to form the first coil comprising a first electrical conductor having at least one first turn terminated by a first end stud and by a second end stud, positioning during a third step subsequent to the second step the at least one piezoelectric transducer having at least one first electrical terminal and one second electrical terminal which are positioned in a plane respectively on the first end stud and on the second end stud, and attaching the at least one first electrical terminal and the second electrical terminal in an electrically conducting manner respectively to the first end stud and to the second end stud, covering during a fourth step subsequent to the third step the first coil and the at least one piezoelectric transducer with the at least one second electrically insulating layer, printing during a fifth step subsequent to the fourth step a second electrically conducting layer on the at least one second electrically insulating layer, to form the second coil comprising a second electrical conductor having at least one second turn terminated by a first end contact and by a second end contact, the second coil being positioned facing the first coil, printing during a sixth step subsequent to the fifth step the third electrically insulating layer on a portion of the second electrically conducting layer and printing a third electrically conducting layer on the third electrically insulating layer, to form the first electrically conducting track and the second electrically conducting track and to connect the first end contact and the second end contact respectively to the first electrically conducting track and to the second electrically conducting track, and attaching during a seventh step subsequent to the sixth step the electronic control circuit to the rigid outer surface and connecting the electronic control circuit by the first electrical connector to the first electrically conducting track and to the second electrically conducting track.

* * * * *